United States Patent
Sharp et al.

(10) Patent No.: US 6,480,990 B1
(45) Date of Patent: Nov. 12, 2002

(54) APPLICATION SPECIFIC INTEGRATED CIRCUIT WITH SPACED SPARE LOGIC GATE SUBGROUPS AND METHOD OF FABRICATION

(75) Inventors: Nolan David Sharp, Santa Clara, CA (US); Henry C. Yu, San Jose, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/561,725

(22) Filed: May 1, 2000

(51) Int. Cl.[7] .............................................. G06F 17/50
(52) U.S. Cl. ..................... 716/8; 716/2; 716/9; 716/11; 716/14
(58) Field of Search ....................... 257/204; 714/710; 174/255; 716/2, 8, 9, 11–14

(56) References Cited

U.S. PATENT DOCUMENTS

| | | | | |
|---|---|---|---|---|
| 5,016,080 A | * | 5/1991 | Giannella | 257/204 |
| 5,432,464 A | | 7/1995 | Darnault | 326/37 |
| 5,796,662 A | | 8/1998 | Kalter et al. | 365/200 |
| 5,936,876 A | | 8/1999 | Sugasawara | 365/51 |
| 5,959,905 A | | 9/1999 | Payne | 365/200 |
| 5,986,468 A | | 11/1999 | Chan et al. | 326/40 |
| 6,163,860 A | * | 12/2000 | Merritt | 714/710 |
| 6,307,162 B1 | * | 10/2001 | Masters et al. | 174/255 |

* cited by examiner

Primary Examiner—Matthew Smith
Assistant Examiner—Thuan Do

(57) ABSTRACT

An application specific integrated circuit (ASIC) and method of manufacture. The ASIC includes a substrate layer, at least one metal layer and an operational block. The metal layer is formed above the substrate layer. The operational block is formed in the substrate layer and the metal layer, and is definable by a two-dimensional boundary. The operational block includes a plurality of operational logic gates, a first subgroup of spare logic gates, a second subgroup of spare logic gates, operational wiring and spare gate wiring. The operational logic gates, the first subgroup and the second subgroup are formed on the substrate layer, with the first subgroup being spaced from the second subgroup. The operational wiring is routed into the metal layer and interconnects the operational logic gates to configure the operational block to perform a desired operation. The spare gate wiring is similarly routed into the metal layer. The spare gate wiring is separate from the operational wiring, and connects at least one of the first subgroup logic gates to at least one of the second subgroup logic gates. In a preferred embodiment, a plurality of metal layers are provided, and a spacing between the subgroups dictates that the spare gate wiring, as formed by an automatic routing tool, extends to the outer metal layers where it is accessible by a focused ion beam device.

21 Claims, 4 Drawing Sheets

APPLICATION SPECIFIC INTEGRATED CIRCUIT WITH SPACED SPARE LOGIC GATE SUBGROUPS AND METHOD OF FABRICATION

THE FIELD OF THE INVENTION

The present invention relates to application specific integrated circuits (ASIC). More particularly, it relates to an ASIC, especially a multiple metal layer ASIC, having easily accessible spare gate wiring.

BACKGROUND OF THE INVENTION

An application specific integrated circuit (ASIC) is a microelectronic integrated circuit chip designed specifically for an application or product, such as a computer system. The ASIC forms, in a single, semi-conductor substrate, the equivalent of several different integrated circuits each designed to perform one or more desired operations, such as a microprocessor operation, a memory operation, various interface operations (e.g., memory interface, processor interface), etc. Effectively, then, the ASIC is definable by one or more operational zones or "blocks" each having desired operational capabilities.

ASIC operational blocks are typically designed to include thousands of individual logic gates necessary for performing the desired operation(s). These logic gates (or "operational logic gates") are formed in a substrate layer according to known semi-conductor fabrication techniques. The operational logic gates can assume a wide variety of forms, and include varying circuitry configurations. Once formed, the various operational logic gates are subsequently interconnected by wiring routed into metal layer(s) formed on top of the substrate. So as to optimize operational block size, the various operational logic gates associated with a particular operational block are located in relative close proximity to one another. By densely packaging the operational logic gates, the length of the interconnecting wiring including individual wiring "runs", is minimized. In accordance with this general design concept, all of the operational logic gates of a particular block are formed within a relatively small area, thereby defining a boundary within which all of the operational logic gates are located. The boundary associated with a particular operational block does not physically appear on the chip, but instead exists in the abstract.

While every effort is made to properly design and configure the ASIC and each individual operational block, invariably performance problems may arise. For example, the operational block may not perform desired operation(s), logic "bugs" may be identified, logic changes required, one or more of the logic gates or wiring may be defective, etc. Rather than scrap the entire chip, repairs are typically performed to correct the identified problem. A widely employed technique for facilitating ASIC repair is to randomly dispense a number of spare logic gates throughout the operational block. A variety of different logic gates, such as AND gates, OR gates, NAND gates, NOR gates, invertors, flip-flops, and registers, are typically provided. The spare logic gates are, similar to the operational logic gates, wired to one another via the metal layer(s). By providing the operational block layout with the spare logic gates, when logic changes are required or desired, one or more the spare logic gates able to correct the problem can be identified and incorporated into the operational logic gate circuitry. As there are already wires between the spare logic gates, it is likely that there will be points along those wires from which the desired spare logic gate(s) can be wired into the functional chip logic.

One readily available technology useful for forming the above-described repair wiring is referred to as focused ion beam (FIB). The FIB technique can be used as an aide in integrated circuit design and debug by performing rapid device alteration. A beam of Ga ions is focused and scanned over the surface of the chip. The interaction of the ion beam with the sample results-in ejection of atoms from the surface (sputtering) is used to expose buried wiring lines for eventually cutting/attaching to other circuit elements. The holes and cuts can be very accurately placed (within about 0.1 $\mu$m) and can reach buried layers. Conversely, FIB can be implemented to deposit a metal layer or wire when performed in the presence of an organometallic gas. This formed metal layer or wire, in turn, can be used to make connections from one device to another.

While the FIB repair technique is highly viable, certain limitations have been identified. In particular, ASIC technology has evolved to require the use of multiple metal layers over the semi-conductor substrate layer. For example, current chip designs incorporate six metal layers. The wiring connecting the various operational logic gates, as well as the spare logic gates, is formed along one or more of these metal layers. Typically, an automatic routing tool determines and routes individual wires as each successive metal layer is formed. Statistically speaking, it is highly likely that the automatic routing tool will route or place the interconnecting wire for closely positioned logic gates along one of the inner most metal layers. Thus, with randomly dispersed spare logic gates, it is impossible to ensure that the associated interconnecting wiring will extend to one of the outer most metal layers; instead, the automatic routing tool will "optimize" wire location to one of the inner most metal layers. While the operational block density is therefore also optimized, the ability to effectuate FIB repairs may be greatly impeded. In general terms, the FIB can access wiring located on the outer most metal layer, as well as the metal layer directly beneath the outer most layer. In addition, FIB may be able to access intermediate metal layers. However, the FIB cannot reach inner metal layers, such as those formed beneath four or more metal layers. In short, FIB technology can only reach wires in the top few metal layers of an ASIC. Where six or more metal layers are employed, spare logic gates connected by wiring formed on the inner most metal layers are essentially useless as the wiring is not accessible by FIB.

Integrated circuit technology continues to evolve and improve. The complexity of ASIC designs has increased exponentially, as well as the fabrication of these chips. In this regard, the availability of spare logic gates to address unforeseen logic/performance problems remains a necessity. However, currently employed ASIC operational block design techniques may render the spare logic gates unusable, especially for multiple metal layer designs. Therefore, a need exists for an ASIC operational block design including spare logic gates strategically located to ensure accessibility by a repair tool, and a method for ensuring this desired configuration. The resulting ASIC would be highly useful for a number of devices, including computer systems.

SUMMARY OF THE INVENTION

One aspect of the present invention provides an application specific integrated circuit. The ASIC includes a substrate layer, at least one metal layer and an operational block. The metal layer is formed above the substrate layer. The operational block is formed in the substrate layer and the metal layer, and is definable by a two-dimensional boundary. With this in mind, the operational block includes a plurality of operational logic gates, a first subgroup of spare logic gates, a second subgroup of spare logic gates, operational wiring and spare gate wiring. The operational logic gates and the spare logic gates are formed in the substrate layer, positioned within the boundary. Further, the first subgroup is spaced from the second subgroup. The operational wiring is formed in the metal layer and interconnects the operational logic gates to configure the operational block to perform a desired operation. Finally, the spare gate wiring is formed in the metal layer. In this regard, the spare gate wiring is separate from the operational wiring, and connects at least one of the first subgroup spare gates to at least one of the second subgroup spare logic gates. In one preferred embodiment, the operational block boundary defines a major dimension, and a spacing between the first and second subgroups is at least one-half the major dimension. In another embodiment, the ASIC includes first, second, third, fourth, fifth, and sixth metal layers sequentially formed above the substrate layer such that the first metal layer is an inner metal layer, proximal the substrate layer. With this configuration, at least a portion of the spare gate wiring extends to the fifth metal layer. By properly spacing the first and second subgroups within the operational block boundary, the resulting spare gate wiring will be accessible by a repair tool, such as an FIB.

Another aspect of the present invention relates to a custom computer system including an application specific integrated circuit. In one embodiment, the ASIC is designed to perform desired operations of the custom computer system, such as processing and/or memory operations. Regardless, the ASIC includes a substrate layer, at least one metal layer and an operational block. The metal layer is formed above the substrate layer. The operational block is formed in the substrate layer and the metal layer, and is definable by a two-dimensional boundary. The operational block further includes a plurality of operational logic gates, a first subgroup of spare logic gates, a second subgroup of spare logic gates, operational wiring and spare gate wiring. These subgroups are spaced from one another within the boundary. The operational wiring is formed in the metal layer and interconnects the operational logic gates to configure the operational block to perform a desired operation of the custom computer system. The spare gate wiring is formed in the metal layer. The spare gate wiring is separate from the operational wiring and connects at least one of the first subgroup spare gates to at least one of the second subgroup spare logic gates. In one preferred embodiment, the ASIC includes a plurality of metal layers, and a spacing between the subgroups dictates that at least a portion of the spare gate wiring extends to one of the outer metal layers.

Yet another aspect of the present invention relates to a method of manufacturing an operational block of an application specific integrated circuit chip. The operational block includes operational logic gates for performing a desired operation. With this in mind, the method includes assigning spare logic gates to one of a first subgroup and a second subgroup. An abstract, two-dimensional boundary is defined for the operational block. A substrate layer is provided. The operational logic gates are formed on the substrate layer. The first and second subgroups are formed on the substrate layer such that each of the subgroups are spaced from one another within the boundary. A metal layer is formed over the substrate layer. Operational wiring is routed in the metal layer interconnecting the operational logic gates. The operational wiring configures the operational block to perform the desired operation. Finally, spare gate wiring is routed into the metal layer, connecting at least one of the first subgroup spare gates to at least one of the second subgroup spare gates. In one preferred embodiment, a plurality of metal layers are formed over the substrate layer and the subgroups are spaced a sufficient distance to ensure extension of the spare gate wiring to one of the outer metal layers.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
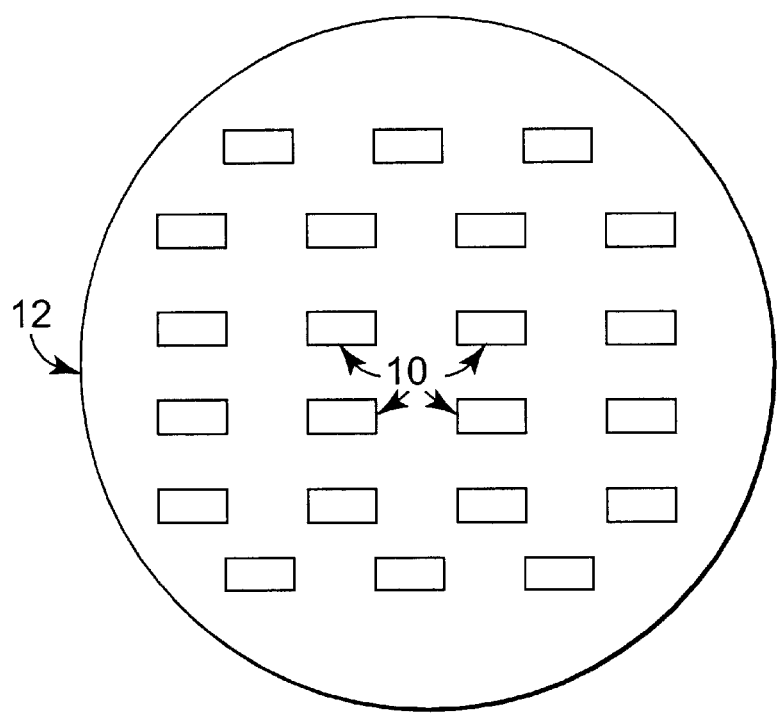
FIG. 1 is a simplified, top plan view of a wafer including an ASIC in accordance with the present invention.

One embodiment of the present invention is directed to an ASIC and a related method of manufacture. One example of an ASIC 10 is illustrated generally in FIG. 1 as part of a wafer 12. As is known in art, the wafer 12 is typically fabricated to include a plurality of the ASICs 10.

Figure 2:
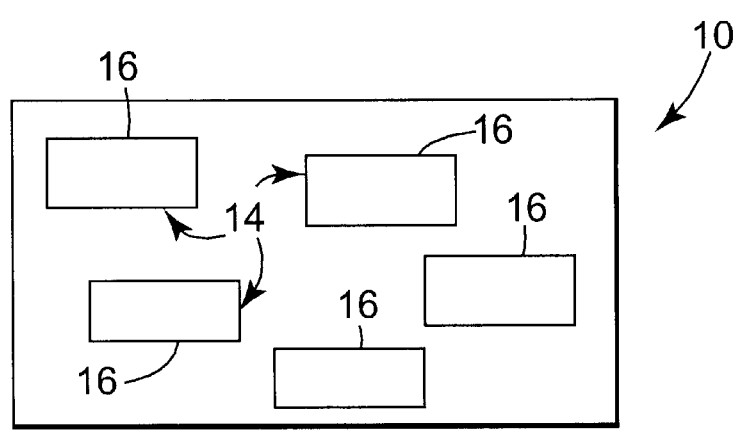
FIG. 2 is an enlarged view of one ASIC of FIG. 1.

The ASIC 10 is shown in greater detail by the simplified plan view of FIG. 2. In general terms, the ASIC 10 is an integrated circuit including one or more operational blocks 14. Each of the operational blocks 14 are depicted in FIG. 2 as having a discernable boundary or perimeter 16. As will be apparent to one of ordinary skill in the art, however, the boundary 16 is not physically formed in the ASIC 10. Instead, each of the operational blocks 14 includes, as described in greater detail below, a vast number of operational gates that are densely packed into a small area. In accordance with accepted operational block layout parameters, the resulting logic gate placements result in the abstract, two-dimensional boundary 16.

Regardless of the exact configuration, the operational blocks 14 are designed to provide the ASIC 10 with a number of different operational characteristics specific to the end application. For example, for a custom computer system, the operational blocks 14 can be designed to serve as one or more of a processor, a memory, a processor interface, memory interface, etc.

Figure 3A:
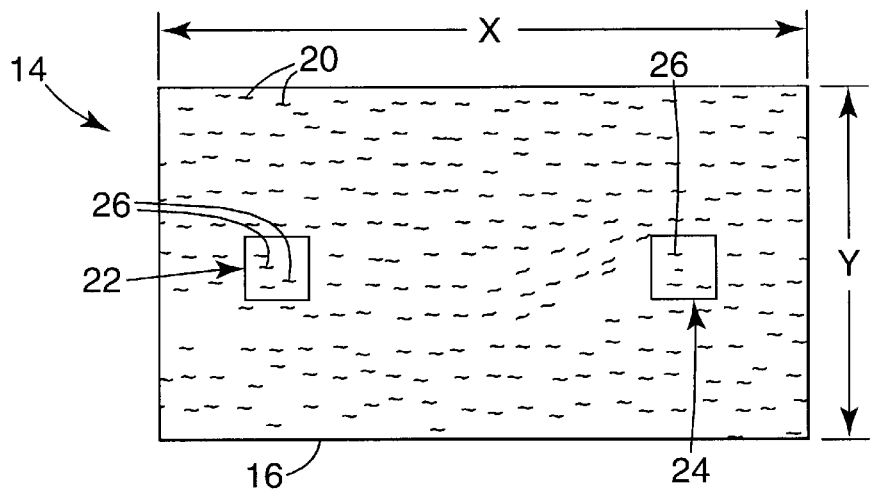
FIG. 3A is a simplified, top plan view of an operational block of the ASIC of FIG. 2.
Figure 3B:
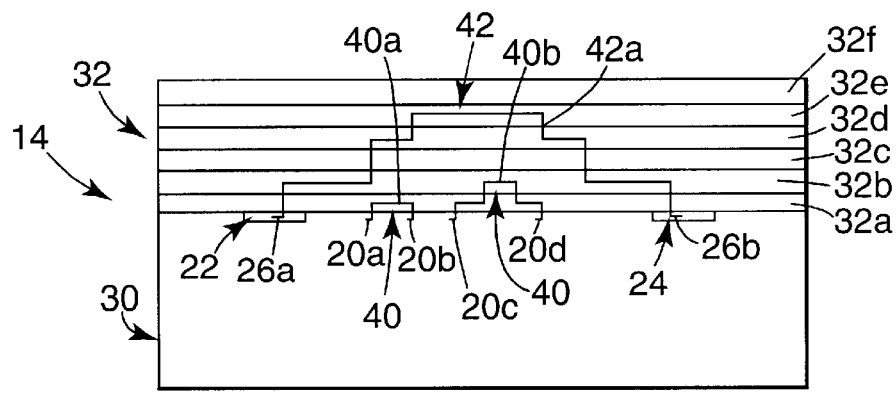
FIG. 3B is simplified cross-sectional view of the operational block of FIG. 3A.

One example of the operational block 14 is shown in greater detail if FIGS. 3A and 3B. As a point of reference, FIG. 3A provides a simplified top plan view of the operational block 14, whereas FIG. 3B is a simplified cross-sectional view of FIG. 3A. In general terms, and as best illustrated in FIG. 3A, the operational block 14 includes a plurality of operational logic gates 20, a first subgroup 22 of spare logic gates and a second subgroup 24 of spare logic gates. Notably, the term "operational logic gate" is in reference to a logic gate designed to form part of the ASIC 10 functional logic, whereas a "spare logic gate" is not, at least initially, used.

Each of the individual operational logic gates 20 can assume a wide variety of known electronic configurations, such as an AND gate, OR gate, NAND gate, NOR gate, flip-flop, invertor, register, etc. The types and quantities of the operational logic gates 20 are specifically selected to produce a desired operation(s) for the operational block 14 once interconnected. As such, the number and location of the operational logic gates 20 will vary depending upon the particular design of the operational block 14 and can include thousands of individual logic gates. For ease of illustration, the relative size of the operational logic gates 20 has been greatly exaggerated.

The first and second subgroups 22, 24 are shown generally in block form in FIG. 3A for ease of illustration. Thus, the subgroups 22, 24 will typically not include a physical border as otherwise depicted in FIG. 3A. Instead, each of the subgroups 22, 24 includes a plurality of spare logic gates (several of which are shown generally at 26) selected in accordance with performance characteristics of the operational block 14 such as AND gates, OR gates, NAND gates, NOR gates, etc. The spare logic gates 26 are clustered or densely positioned within each of the respective subgroups 22, 24. As a point of reference, a maximum spacing between the individual spare logic gates 26 within a respective subgroup is on the order of 2 microns. In a preferred embodiment, each of the subgroups 22, 24 includes 20–50 spare logic gates, although any other number, either greater or smaller, is equally acceptable. Further, more than two of the subgroups 22,24 can be provided.

As best illustrated by the simplified, cross-sectional view of FIG. 3B, the ASIC 10 onto which the operational block 14 is formed includes a substrate layer 30 and at least one metal layer 32. As is known in the semi-conductor fabrication industry, the substrate layer 30 is formed of an acceptable semi-conductive material, preferably silicon or germanium.

The metal layer 32 is formed from an appropriate metallic material, preferably copper or aluminum, above the substrate layer 30. In a preferred embodiment, a plurality of metal layers are provided. In a more preferred embodiment, six metal layers 32a–32f are sequentially formed over the substrate layer 30. With this configuration, the first metal layer 32a is an inner most metal layer, proximal the substrate layer 30. Conversely, the sixth metal layer 32f is an outer most layer, distal the substrate layer 30. Alternatively, any other number of metal layers 32 can be provided. For example, additional metal layers can be formed over the sixth metal layer 32f. With the preferred multiple metal layer construction, reference can be made to "outer layers," which encompasses the outer most two or three metal layers 32, such as, for example, the fifth and sixth metal layers 32e, 32f. Conversely, reference can be made to "inner layers," which encompasses the inner most two or three metal layers 32, such as, for example, the first and second metal layers 32a, 32b. The metal layers 32 between the outer layers and the inner layers can be referred to as "intermediate layers," for example the third and fourth metal layers 32c, 32d.

Regardless of the number of layers provided, the metal layer(s) 32 provides a conductive surface through which the various logic gates are connected. This electrical connection is provided in the form of operational wiring 40 and spare gate wiring 42, each of which includes a series of individual wires routed into the metal layer(s) 32. As previously described, the operational block 14 includes thousands of individual operational logic gates 20. Each of the operational logic gates 20 are interconnected by the operational wiring 40 to configure the operational block 14 to perform a desired operation. Thus, although not shown in FIG. 3B, the operational wiring 40 consists of thousands of individual "wires" routed into the various metal layers 32. For example, the operational logic gates 20a, 20b are electrically connected by the wire 40a, and the operational logic gates 20c, 20d are electrically connected by the wire 40b.

As described in greater detail below, routing of the operational wiring 40 is performed by an automatic routing tool (not shown). Each of the metal layers 32a–32f are available for wire routing runs. As a general rule, however, the automatic routing tool optimizes wiring density by limiting, as much as possible, the formation of wiring in the outer metal layers, such as the metal layers 32e, 32f. More particularly, for closely spaced operational logic gates 20, the automatic routing tool will limit the associated operational wiring 40 to the first or second metal layer 32a, 32b. To this end, layout of the operational logic gates 20 typically strives to place related operational logic gates in close proximity to one another. Thus, for example, the operational gates 20a, 20b are located in close proximity to one another. As a result, the associated operational wire 40a extends only to the first metal layer 30a. Similarly, the operational logic gates 20c, 20d are separated slightly from one another. The associated operational wire 40b extends along the first metal layer 32a and the second metal layer 32b.

The spare logic gates 26 comprising the first and second subgroups 22, 24 are similarly electrically connected to one another by the spare gate wiring 42 (shown generally in FIGS. 3A and 3B). The spare gate wiring 42 preferably includes a number of individually routed wires. Thus, for example, one of the spare logic gates (referenced as 26a) of the first subgroup 22 is connected to a respective one of the spare logic gates (referenced as 26b) of the second subgroup 24 by an individual wire (referenced as 42a). Based upon this connection pattern, it will be understood that the individual spare logic gates 26 comprising each of the first and second subgroups 22, 24 are selected and connected in accordance with possible repair requirements of the operational block 14. Once again, the spare gate wiring 42 is formed or routed by an automatic routing tool. With the above-described statistical tendency of the automatic routing tool to limit shorter wiring "runs" to the inner metal layers, such as the metal layers 32a, 32b, the first and second subgroups 22, 24 are formed on the substrate layer 30 so as to be spaced from one another, thereby ensuring that the spare gate wiring 42 extends to the outer metal layers, such as the metal layers 32e, 32f.

Figure 3C:
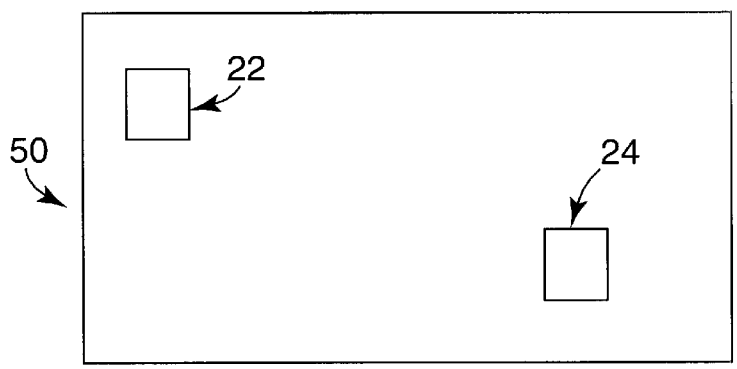
FIG. 3C is a simplified top plan view of an alternative operational block in accordance with the present invention.

A desired spacing of the subgroups 22, 24 is best described with respect to dimensions provided by the boundary 16. For example, with reference to the orientation of FIG. 3A, the boundary 16 can be described as defining a major dimension X and a minor dimension Y. In a preferred embodiment, a spacing or distance between the subgroups 22, 24 is at least one-half the major dimension X; most preferably at least two-thirds the major dimension X. For example, in one preferred embodiment, the boundary 16 has a major dimension of approximately 4 mm and a minor dimension of approximately 1 mm. With these dimensions in mind, the subgroups 22, 24 are spaced by approximately 2–3 mm. Further, to optimize gate density, the subgroups 22, 24 are preferably centered relative to the minor dimension Y. It should be understood that the subgroup 22, 24 locations illustrated in FIG. 3A is but one example of an acceptable layout. Depending upon necessary operational logic gate positioning, it may not be possible to symmetrically position the subgroups 22, 24 relative to the boundary 16. For example, FIG. 3C provides a simplified, plan view of an alternative operational block 50 including the first subgroup 22 and the second subgroup 24. As is evident from FIG. 3C, the subgroups 22, 24 need not be centered relative to the boundary 16; however, the desired spacing between subgroups 22, 24 is still provided.

Returning to FIG. 3B, the spacing between subgroups 22, 24 dictates that the spare gate wiring 42 extends beyond the inner metal layer(s), such as the first and second layers 32a, 32b, to the outer layer(s), such as the fifth layer 32e. Once again, the automated routing tool utilizes certain algorithms to determine placement/extension of the spare gate wiring 42. By providing a relatively large spacing between the subgroups 22, 24, the automatic routing tool is effectively "forced" to route the spare gate wiring 42 into the outer metal layers, such as the layers 32e, 32f. Although not shown in FIG. 3B, it will be understood that each of the subgroups 22, 24 includes a number of individual spare logic gates and that the spare gate wiring 42 includes a number of individual wires, such as the wire 42a, extending between the subgroups 22, 24. Preferably, then, each of the individual spare gate wires extends to the outer metal layers, such as one of the metal layers 32e, 32f.

Fabrication of the ASIC 10 is described in greater detail below. Following fabrication, however, it may be necessary to incorporate one or more of the spare logic gates comprising the subgroups 22, 24 into the functional logic provided by the operational block 14. If so required, a FIB tool (not shown) can access the spare gate wiring 42 at the outer metal layer(s). With reference to the specific embodiment provided in FIG. 3B, the FIB can consistently pass through, and therefore access, wiring formed in the fifth and sixth metal layers 32e, 32f. Further, the FIB may be able to access the third and fourth metal layers 32c, 32d. However, due to inherent FIB limitations, as well as wiring density, it is likely impossible for the FIB to access wiring formed in the first and second metal layers 32a, 32b. Therefore, by routing at least a portion of the spare gate wiring 42 along the outer metal layers, such as the fifth or sixth metal layers 32e, 32f, the availability of the spare logic gates 26 associated with the spare gate wiring 42 is ensured.

Figure 4:
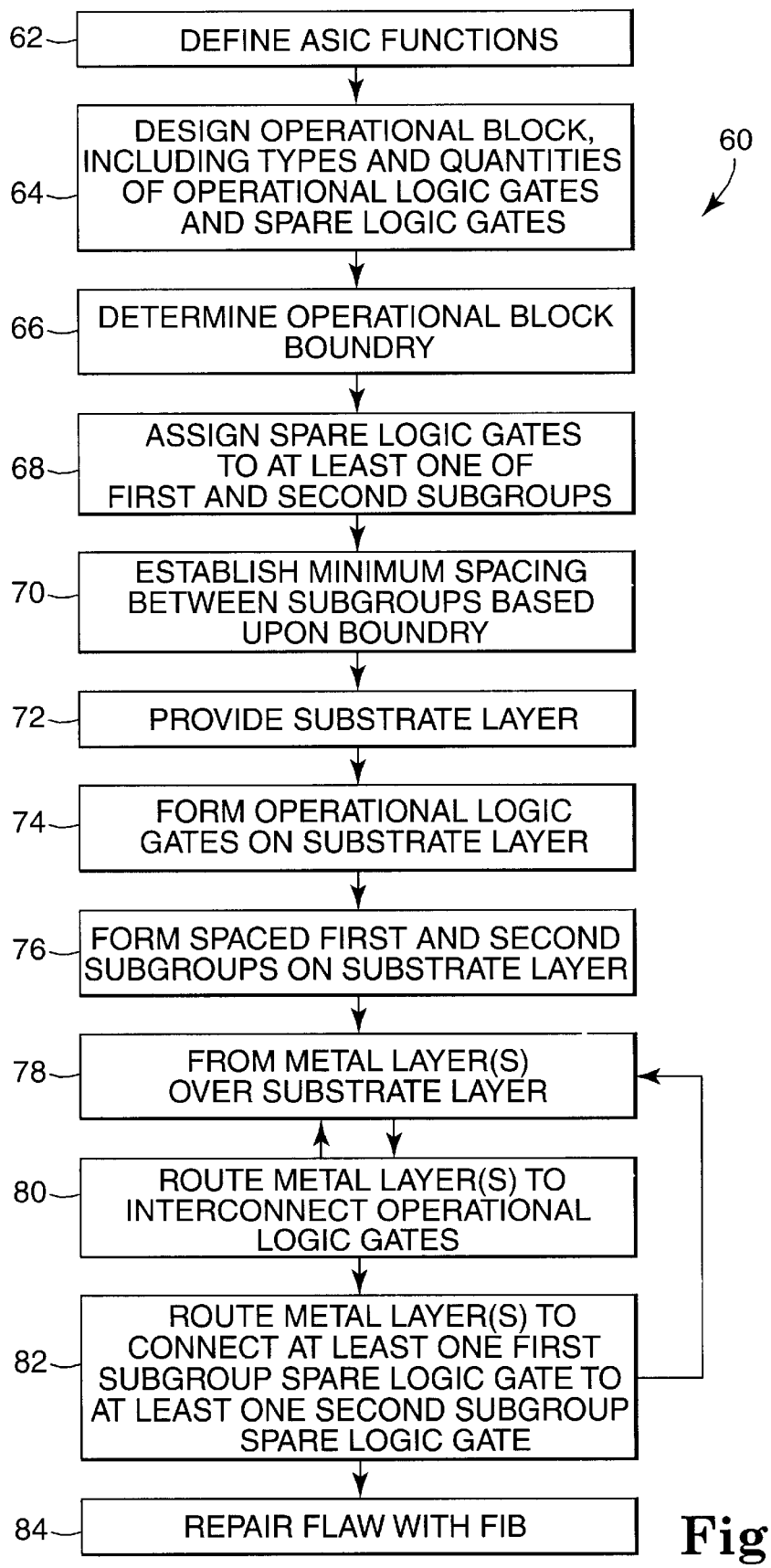
FIG. 4 is a flow diagram illustrating one embodiment of a method of manufacturing an ASIC in accordance with the present invention.

One embodiment of the method of manufacturing the ASIC 10, and in particular, the operational block 14, is illustrated generally at 60 in flow diagram form in FIG. 4. At step 62, and with additional reference to FIGS. 3A and 3B, desired operating parameters or functions of the ASIC 10 are defined. The desired functions are application specific. Thus, for example, when the ASIC 10 is for use with a custom computer system (not shown), the defined functions can include processing, memory, etc. As is known in the art, a wide variety of functions are available.

At step 64, the operational block(s) 14 comprising the ASIC 10 is designed. The basic operational block 14 design is based upon the defined ASIC functions. In this regard, a plurality of operational blocks 14 can be designed, each configured to have one or more operational characteristics. Regardless, design of the operational block 14 includes the types and quantities of the operational logic gates 20 necessary for configuring the operational block 14 to perform the desired operation(s). In addition, design of the operational block 14 includes determining types and quantities of spare logic gates 26. As is known in the art, the types and quantities of spare logic gates correlates with the selected operational logic gates.

At step 66, the boundary 16 of the operational block 14 is determined. Once again, as previously described, the boundary 16 is an abstract, two-dimensional feature, the size or parameters of which are based upon the previously selected operational logic gates 20.

At step 68, the selected spare logic gates are assigned to at least one of the first subgroup 22 and the second subgroup 24. The spare logic gates can be randomly assigned. Alternatively, the spare logic gates 26 can be specifically assigned based upon circuitry/logic characteristics.

At step 70, a minimum spacing between the subgroups 22, 24 is established. In one preferred embodiment, this minimum spacing is based upon dimensions defined by the operational block boundary 16. As previously described, the abstract boundary 16 is definable by a major dimension (such as the major dimension X in FIG. 3A). The minimum spacing established at step 70 is preferably formulated as a function of this major dimension X; for example, a minimum spacing of at least one-half the major dimension X, more preferably at least two-thirds the major dimension X. In addition, specific locations of the subgroups 22, 24 relative to the boundary 16 can be defined. For example, a specific location of the first subgroup 22 relative to the boundary 16 can be specified, for example centered relative to the minor dimension (such as the minor dimension Y of FIG. 3A) and one-third the major dimension X. Based upon the minimum spacing requirements, a location of the second subgroup 24 is similarly established. For example, the second subgroup 24 can be spaced from the first subgroup 22 by distance of two-thirds the major dimension X.

At step 72, the substrate layer 30 is provided. The operational logic gates 20 are formed on the substrate layer 30 at step 74. As is known in the art, the operational logic gates 20 are formed by an automatic gate placement tool. The gate placement tool locates each of the operational gates 20 within the boundary 16, positioning associated gates in close proximity to one another.

At step 76, the first and second subgroups 22, 24 are formed on the substrate layer 30. As previously described, each of the first and second subgroups 22, 24 includes a plurality of spare logic gates 26. Similar to the operational logic gates 20, the spare logic gates 26 are formed by an automatic gate placement tool. As such, the spare logic gates 26, and thus the first and second subgroups 22, 24, can be formed simultaneously with the operational logic gates 20, or before or after the operational logic gates 20 are positioned. Regardless, each of the first and second subgroups 22, 24 are formed to include a plurality of clustered spare logic gates, preferably in the range of approximately 20–50 spare logic gates. Further, the subgroups 22, 24 are spaced within the boundary 16 in accordance with the minimum spacing requirements established at step 70. In one preferred embodiment, the automated gate placement tool is provided with programming instructions relating to either the established minimum spacing between the subgroups 22, 24, or specific locations of the subgroups 22, 24.

At step 78, one or more of the metal layers 32 are formed on the substrate layer 30. In one preferred embodiment, six of the metal layers 32a–32f are sequentially formed over the substrate layer 30. Alternatively, any other number of metal layers 32 is acceptable.

At step 80, the metal layer(s) 32 is routed to form the operational wiring 40 that interconnects the operational logic gates 20. In a preferred embodiment, an automatic routing tool (not shown) is utilized to route the metal layer(s) 32. With a multiple metal layer 32 configuration, each metal layer 32 is routed to form a portion, or an entirety, of each individual operational wire prior to formation of the successive metal layer 32. For example, with reference to the operational logic gates 20a, 20b, the first metal layer 32a is routed with the wire 40a prior to placement of the second metal layer 32b. Similarly, with respect to the operational logic gates 20c, 20d, the first metal layer 32a is routed to form a portion of the wire 40b prior to the formation of the second metal layer 32b. The second metal layer 32b, in turn, is routed to complete the wire 40b prior to placement of the third metal layer 32c. Regardless, the operational wiring 40 configures the operational logic gates 20, and thus, the operational block 14, to perform the desired operation(s).

At step 82 the metal layer(s) 32 is routed to form the spare gate wiring 42 connecting at least one of the spare logic gates 26 of the first subgroup 22 to at least one of the spare logic gates 26 of the second subgroup 24. In one preferred embodiment, the spare gate wiring 42 includes a plurality of individual wires electrically connecting each of the subgroup 22, 24 spare logic gates, respectively. Similar to the operational wiring 40, the spare gate wiring 42 is preferably formed or routed in the metal layer(s) 32 by an automatic routing tool. In this regard, where a plurality of metal layers 32 are provided, the spacing between the subgroups 22, 24 dictates or "forces" the automatic routing tool to extend the spare gate wiring 42 along the outer metal layers (for example, the metal layers 32e of FIG. 3B). That is to say, because the spare gate wiring 42 is essentially as series of long wire "runs," the automatic routing tool will, based upon internal algorithms, make the long runs along the outer metal layers 32. Notably, no specific routing instructions or programming are required. As previously described, each metal layer 32 is routed with a portion of the spare gate wiring 42 prior to formation of a successive metal layer 32.

During use or testing, it may be determined that the operational block 14 has a flaw, for example, at step 84. For example, a problem relating to operational block logic, operational logic gate formation, wiring, etc., may be identified. In one preferred embodiment, this problem is corrected by implementing one or more of the spare logic gates 26 into the operational block circuitry. In particular, a FIB tool is used to access the spare gate wiring 42 associated with the appropriate spare logic gate(s) 26. Because the spare gate wiring 42 extends to the outer metal layer (such as one of the metal layers 32e of FIG. 3B), FIB access is ensured.

Figure 5:
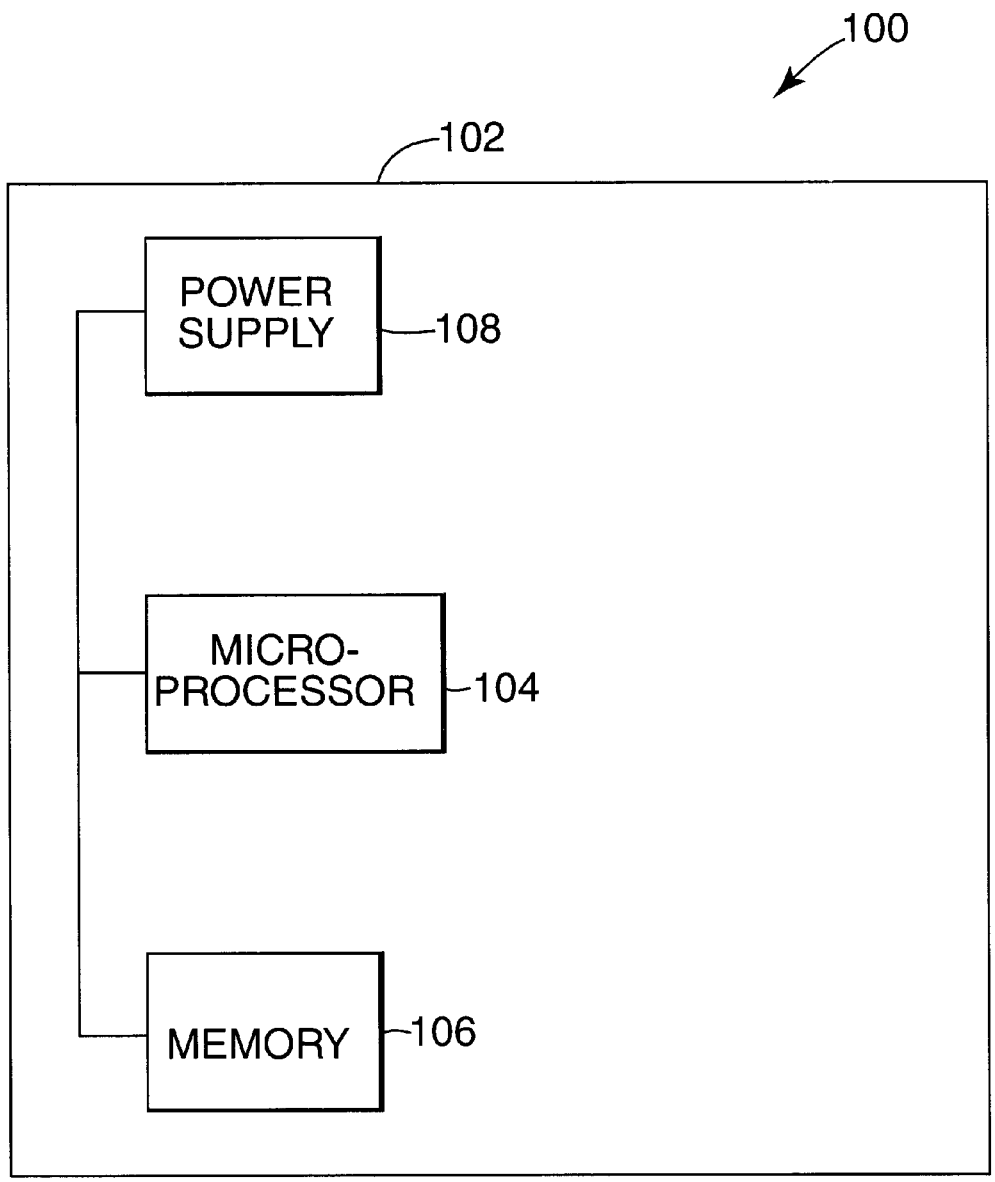
FIG. 5 is a block diagram of a general-purpose computer system on which embodiments of the present invention can be implemented.

The above-described ASIC 10 can be designed for use with a wide variety of applications. For example, in one preferred embodiment, the ASIC 10 is used in conjunction with a custom computer system. One embodiment of a computer system according to the present invention is illustrated generally at 100 in FIG. 5 in block diagram form. The computer system 100 includes a housing 102 surrounds electronic components and other internal components of the computer system 100. In this regard, the computer system 100 includes a microprocessor 104 for performing sequences of logical operations and a memory 106 for storing instructions and data for use by the microprocessor 104. The memory 106 typically includes random access memory (RAM), non-volatile memory, and a hard disk drive, but can include any known type of memory storage. A power supply 108 supplies regulated voltage power to devices in the computer system 100, such as the microprocessor 104 and the memory 106.

With the above-description of the computer system 100 in mind, the ASIC 10 (FIG. 2) can serve as, or as part of, one or more of the electronic components of a computer system 100, such as the microprocessor 104, the memory 106, etc. Further, the ASIC 10 can serve as, or as part of, other integrated circuit components and/or discrete logic components not otherwise specifically depicted in FIG. 5.

The ASIC design, and in particular, the operational block design of the present invention provides a marked improvement over previous designs. Spare logic gates are assigned and clustered into at least two subgroups. The so-defined subgroups are spaced from one another within the operational block boundary. This spacing, in turn, dictates that the spare gate wiring connecting the various spare logic gates will extend to outer metal layers associated with the ASIC. Where necessary, operational block repairs are easily performed by a FIB tool that readily accesses the spare gate wiring. Notably, the method of manufacture of the present invention requires only that spacing and/or placement instructions for the spare logic gate subgroups be provided to the automatic placement tool. The more difficult task of programming the automatic routing tool to effectuate certain spare gate wiring runs is avoided.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. An application specific integrated circuit comprising:
    a substrate layer;
    at least one metal layer formed above the substrate layer; and
    an operational block formed in the substrate layer and the metal layer, the operational block definable by a two-dimensional boundary and including:
        a plurality of operational logic gates,
        a first subgroup of spare logic gates,
        a second subgroup of spare logic gates,
        wherein the first subgroup is spaced from the second subgroup on the substrate layer,
        operational wiring formed in the metal layer interconnecting the operational logic gates to configure the operational block to perform a desired operation,
        spare gate wiring formed separate from the operational wiring in the at least one metal layer, the spare gate wiring connecting at least one of the first subgroup spare logic gates to at least one of the second subgroup spare logic gates.

2. The application specific integrated circuit of claim 1, wherein the boundary defines a major dimension, and further wherein a spacing between the first and second subgroups is at least one-half the major dimension.

3. The application specific integrated circuit of claim 2, wherein the spacing is at least two-thirds the major dimension.

4. The application specific integrated circuit of claim 2, wherein the boundary is generally rectangular and defines a minor dimension, and further wherein the first and second subgroup are substantially centered along the minor dimension.

5. The application specific integrated circuit of claim 1, wherein each of the first and second subgroups includes at least 25 spare logic gates.

6. The application specific integrated circuit of claim 1, wherein the spare logic gates of the first subgroup are spaced from one another by approximately 2 microns.

7. The application specific integrated circuit of claim 1, further comprising a plurality of metal layers including an inner metal layers positioned between outer metal layers and the substrate, and further wherein at least a portion of the spare gate wiring extends to the outer metal layers.

8. The application specific integrated circuit of claim 1, further comprising:
   first, second, third, fourth, fifth, and sixth metal layers sequentially formed above the substrate layer such that the first metal layer is proximal the substrate layer;
   wherein at least a portion of the spare gate wiring extends to the fifth metal layer.

9. The application specific integrated circuit of claim 8, wherein the spare gate wiring includes a plurality of wires each connecting a respective one of the first subgroup spare logic gates to a respective one of the second subgroup spare logic gates, and further wherein at least a portion of each of the plurality of wires extends to the fifth metal layer.

10. The application specific integrated circuit of claim 1, wherein at least a portion of the spare gate wiring is formed to be accessible by a focused ion beam device.

11. The application specific integrated circuit of claim 1, wherein the spare gate wiring connects at least one of the first subgroup spare logic gates directly to at least one of the second subgroup spare logic gates.

12. A custom computer system comprising:
   an application specific integrated circuit including:
      a substrate layer,
      at least one metal layer formed above the substrate layer, and
      an operational block formed in the substrate layer and the metal layer, the
   operational block definable by a two-dimensional boundary and including:
      a plurality of operational logic gates,
      a first subgroup of spare logic gates,
      a second subgroup of spare logic gates,
      wherein the first subgroup is spaced from the second subgroup on the substrate layer,
      operational wiring formed in the metal layer interconnecting the operational logic gates to configure the operational block to perform a desired operation,
      spare gate wiring formed separate from the operational wiring in the metal layer, the spare gate wiring connecting at least one of the first subgroups spare logic gates to at least one of the second subgroup spare logic gates.

13. The custom computer system of claim 12, wherein the boundary defines a major dimension, and further wherein a spacing between the first and second subgroups is at least two-thirds the major dimension.

14. The custom computer system of claim 12, wherein the application specific integrated circuit chip further comprises:
   first, second, third, fourth, fifth, and sixth metal layers sequentially formed above the substrate layer such that the first metal layer is proximal the substrate layer;
   wherein at least a portion of the spare gate wiring extends to the fifth metal layer.

15. A method of manufacturing an operational block portion of an application specific integrated circuit, the operational block including operational logic gates for performing a desired operation, the method comprising:
   assigning spare logic gates to one of a first subgroup and a second subgroup;
   defining an abstract, two-dimensional boundary for the operational block;
   providing a substrate layer;
   forming the operational logic gates on the substrate layer, within the boundary;
   forming the first and second subgroups on the substrate layer such that the subgroups are spaced from one another within the boundary;
   forming a metal layer over the substrate layer;
   routing operational wiring in the metal layer interconnecting the operational logic gates to configure the operational block to perform a desired operation; and
   routing spare gate wiring in the metal layer, the spare gate wiring connecting at least one of the first subgroup spare gates to at least one of the second subgroup spare gates.

16. The method of claim 15, wherein the boundary is definable by a major dimension, and further wherein forming the first and second subgroup includes spacing the first subgroup from the second subgroup by a distance of at least one-half the major dimension.

17. The method of claim 16, wherein the distance between the first and second subgroups is at least two-thirds the major dimension.

18. The method of claim 16, wherein the subgroups are formed by a gate placement tool, the method further comprising:
   providing programming instructions to the gate placement tool requiring that the first subgroup be spaced from the second subgroup by the distance of at least one-half the major dimension.

19. The method of claims further comprising:
   forming a plurality of metal layers over the substrate layer, the plurality of metal layers including inner layers, outer layers above the inner layers;
   wherein routing the spare gate wiring includes forming at least a portion of the spare gate wiring in at least one of the outer layers.

20. The method of claim 19, wherein the plurality of metal layers includes a first, second, third, fourth, fifth, and sixth metal layers sequentially formed over the substrate layer such that the first metal layer is proximal the substrate layer, and further wherein routing the spare gate wiring includes forming at least a portion of the spare gate wiring in the fifth layer.

21. The method of claim 19, wherein an automatic routing tool routes the spare gate wiring, the method further comprising:
   establishing a minimum spacing between the subgroups, the minimum spacing being selected to force the automatic routing tool to form a portion of the spare gate wiring in the outer layers.

* * * * *

UNITED STATES PATENT AND TRADEMARK OFFICE
CERTIFICATE OF CORRECTION

PATENT NO. : 6,480,990 B1
DATED : November 12, 2002
INVENTOR(S) : Nolan David Sharp et al.

It is certified that error appears in the above-identified patent and that said Letters Patent is hereby corrected as shown below:

Column 12,
Line 44, delete "claims" and insert therefor -- claim 14, --

Signed and Sealed this

Fifth Day of October, 2004

JON W. DUDAS
*Director of the United States Patent and Trademark Office*